(12) United States Patent
Zheng et al.

(10) Patent No.: US 12,272,685 B2
(45) Date of Patent: Apr. 8, 2025

(54) BEZEL-LESS DISPLAY PANEL, DISPLAY DEVICE, AND SPLICE-TYPE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Wu Zheng, Hubei (CN); Zengjian Jin, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 18/421,244

(22) Filed: Jan. 24, 2024

(65) Prior Publication Data
US 2024/0194658 A1   Jun. 13, 2024

Related U.S. Application Data

(63) Continuation of application No. 17/051,246, filed as application No. PCT/CN2020/114641 on Sep. 11, 2020, now Pat. No. 11,942,461.

(30) Foreign Application Priority Data

Jul. 17, 2020 (CN) .......................... 202010693112.5

(51) Int. Cl.
*H01L 25/16* (2023.01)
*H01L 25/075* (2006.01)
(Continued)

(52) U.S. Cl.
CPC ........ *H01L 25/167* (2013.01); *H01L 25/0753* (2013.01); *H01L 27/124* (2013.01); *H01L 33/24* (2013.01); *H01L 33/62* (2013.01)

(58) Field of Classification Search
None
See application file for complete search history.

(56) References Cited

U.S. PATENT DOCUMENTS

2023/0378241 A1* 11/2023 Lius ...................... H10K 59/65

FOREIGN PATENT DOCUMENTS

CN   105047686 A   11/2015
CN   106297572 A   1/2017
(Continued)

OTHER PUBLICATIONS

Chinese Office Action issued in corresponding Chinese Patent Application No. 202010693112.5 dated May 8, 2021, pp. 1-8.
(Continued)

*Primary Examiner* — Feifei Yeung Lopez

(57) ABSTRACT

A bezel-less display panel, a display device, and a spliced display device are disclosed. The bezel-less display panel includes a first display area, a second display area around the first display area, and a third display area around the second display area. The third display area is not provided with a subpixel driving thin-film transistor. Some of driving thin-film transistors in the second display area are connected to light-emitting subpixels in the third display area through a plurality of metal lines.

20 Claims, 4 Drawing Sheets

(51) Int. Cl.
*H01L 27/12* (2006.01)
*H01L 33/24* (2010.01)
*H01L 33/62* (2010.01)

(56) References Cited

FOREIGN PATENT DOCUMENTS

| CN | 110504289 A | 11/2019 |
|----|-------------|---------|
| CN | 110874990 A | 3/2020 |
| CN | 111048005 A | 4/2020 |
| CN | 111180494 A | 5/2020 |
| CN | 111180501 A | 5/2020 |
| CN | 111192902 A | 5/2020 |
| JP | 2004170870 A | 6/2004 |

OTHER PUBLICATIONS

Chinese Office Action issued in corresponding Chinese Patent Application No. 202010693112.5 dated Jan. 11, 2022, pp. 1-7.
Chinese Decision of Rejection issued in corresponding Chinese Patent Application No. 202010693112.5 dated Jul. 5, 2022, pp. 1-5.
International Search Report in International application No. PCT/CN2020/114641, mailed on Apr. 15, 2021.
Written Opinion of the International Search Authority in International application No. PCT/CN2020/114641, mailed on Apr. 15, 2021.
Indian Office Action issued in corresponding Indian Patent Application No. 202147015088 dated Apr. 13, 2023, pp. 1-6.
European Office Action issued in corresponding European Patent Application No. 20880335.3 dated Jun. 26, 2024, pp. 1-9.

* cited by examiner

BEZEL-LESS DISPLAY PANEL, DISPLAY DEVICE, AND SPLICE-TYPE DISPLAY DEVICE

This application is a continuation of U.S. application Ser. No. 17/051,246, filed 28 Oct. 2020, which was a National Stage of International Application No. PCT/CN2020/114641, filed 11 Sep. 2020, which claims the benefit of and priority to Chinese Application No. 202010693112.5, filed 17 Jul. 2020, the entireties of which are hereby incorporated herein by reference.

BACKGROUND OF INVENTION

1. Field of Invention

The present invention relates to a technical field of displays, and particularly to, a bezel-less display panel, a display device, and a splice-type display device.

2. Related Art

With development of display technologies and advancement in related techniques, display panels have been used in wider applications, for example, industries such as advertising, automobiles, and mobile phones. Especially in automobile markets, requirements for size of display panels used in applications, such as in-vehicle panoramic display, traffic control centers etc. are higher than others. As a result, multiple small-sized panels are spliced into a large-sized display, then image segmentation technology is used to transmit signals to each separate small-sized display screen for formation of a full display.

However, because each of the small-sized panels is equipped with an outer frame incapable of displaying, a screen aspect ratio of a large-sized display formed by a plurality of small-sized panels spliced together is therefore reduced, resulting in a low screen aspect ratio. Furthermore, splicing marks unavoidably appear between the small-sized panels, causing visual imperfections and adversely affecting display performance. Therefore, it is imperative to overcome the above-mentioned drawbacks.

SUMMARY OF INVENTION

An object of the present invention is to provide a bezel-less display panel to overcome technical problems with conventional display panels which have a low screen aspect ratio caused by outer frames being incapable of displaying, and which form splicing marks when being configured to be spliced into a large-sized display, adversely affecting display performance.

In order to achieve the above-mentioned object, an embodiment of the present provides a bezel-less display panel, comprising a first display area, a second display area around the first display area, and a third display area around the second display area; wherein each of the first display area and the second display area is provided with a plurality of subpixel driving thin-film transistors (TFTs), the subpixel driving TFTs in the first display area have a distribution density equal to a distribution density of the subpixel driving TFTs in the second display area, each of the first display area, the second display area, and the third display area is provided with a plurality of light-emitting subpixels, and a distribution density of the light-emitting subpixels in the first display area is greater than that of the light-emitting subpixels in the second display area; wherein the third display area is not provided with a subpixel driving TFT, some of the subpixel driving TFTs in the second display area are connected to the light-emitting subpixels in the second display area, and the other subpixel driving TFTs in the second display area are connected to the light-emitting subpixels in the third display area through a plurality of metal lines.

In a bezel-less display panel provided by an embodiment of the present application, the second display area comprises a first straight area and a first corner area, and the third display area comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

In a bezel-less display panel provided by an embodiment of the present application, the metal lines configured to connect the light-emitting subpixels in the second straight area to the subpixel driving TFTs in the first straight area are arranged in a horizontal direction or in a vertical direction.

In a bezel-less display panel provided by an embodiment of the present application, the metal lines configured to connect the light-emitting subpixels in the second corner area to the subpixel driving TFTs in the first corner area are arranged in an oblique direction, wherein a first angle is formed between the oblique direction and the horizontal direction or the vertical direction.

In a bezel-less display panel provided by an embodiment of the present application, the first angle is an acute angle.

In a bezel-less display panel provided by an embodiment of the present application, a sum of number of the light-emitting subpixels in the second display area and number of the light-emitting subpixels in the third display area is equal to number of the subpixel driving TFTs in the second display area.

In a bezel-less display panel provided by an embodiment of the present application, the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

In a bezel-less display panel provided by an embodiment of the present application, the light-emitting subpixels are arranged in an array and are configured with a plurality of the pixel units comprising a first pixel unit and a second pixel unit; wherein two of the green subpixels of the first subpixel unit are located on a same side, and one of the red subpixels and one of the blue subpixels of the first subpixel unit are located on another side, and the one of the red subpixels is located above the one of the blue subpixels; and wherein two of the green subpixels of the second subpixel unit are located on a same side, and one of the red subpixels and one of the blue subpixels of the second subpixel unit are located on another side, and the one of the blue subpixels is located above the one of the red subpixels.

In a bezel-less display panel provided by an embodiment of the present application, the green subpixels are disposed to correspond to middle and lower positions with respect to the red subpixels and the blue subpixels, respectively.

In a bezel-less display panel provided by an embodiment of the present application, any row of the pixel units is configured with a plurality of the first pixel units and the second pixel units arranged in a repeating order of the first pixel unit to the second pixel unit.

In a bezel-less display panel provided by an embodiment of the present application, each of the green subpixels has a light-emitting area less than a light-emitting area of each of the red subpixels and blue subpixels.

In a bezel-less display panel provided by an embodiment of the present application, each of the light-emitting subpixels is circular, triangular, or rectangular in shape.

An embodiment of the present provides a display panel, comprising display device, comprising a back frame; and a bezel-less display panel disposed on the back frame, wherein the bezel-less display panel comprises a first display area, a second display area around the first display area, and a third display area around the second display area; wherein each of the first display area and the second display area is provided with a plurality of subpixel driving thin-film transistors (TFTs), the subpixel driving TFTs in the first display area have a distribution density equal to a distribution density of the subpixel driving TFTs in the second display area, each of the first display area, the second display area, and the third display area is provided with a plurality of light-emitting subpixels, and a distribution density of the light-emitting subpixels in the first display area is greater than that of the light-emitting subpixels in the second display area; and wherein the third display area is not provided with a subpixel driving TFT, some of the subpixel driving TFTs in the second display area are connected to the light-emitting subpixels in the second display area, and the other subpixel driving TFTs in the second display area are connected to the light-emitting subpixels in the third display area through a plurality of metal lines.

In a display panel provided by an embodiment of the present application, the second display area comprises a first straight area and a first corner area, and the third display area comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

In a display panel provided by an embodiment of the present application, a sum of number of the light-emitting subpixels in the second display area and number of the light-emitting subpixels in the third display area is equal to number of the subpixel driving TFTs in the second display area.

In a display panel provided by an embodiment of the present application, the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

An embodiment of the present provides a splice-type display device, comprising a back frame; and a plurality of bezel-less display panels disposed on the back frame and configured to provide a display surface, wherein each of the bezel-less display panels comprises a first display area, a second display area around the first display area, and a third display area around the second display area; wherein each of the first display area and the second display area is provided with a plurality of subpixel driving thin-film transistors (TFTs), the subpixel driving TFTs in the first display area have a distribution density equal to a distribution density of the subpixel driving TFTs in the second display area, each of the first display area, the second display area, and the third display area is provided with a plurality of light-emitting subpixels, and a distribution density of the light-emitting subpixels in the first display area is greater than that of the light-emitting subpixels in the second display area; and wherein the third display area is not provided with a subpixel driving TFT, some of the subpixel driving TFTs in the second display area are connected to the light-emitting subpixels in the second display area, and the other subpixel driving TFTs in the second display area are connected to the light-emitting subpixels in the third display area through a plurality of metal lines.

In a splice-type display device provided by an embodiment of the present application, the second display area comprises a first straight area and a first corner area, and the third display area comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

In a splice-type display device provided by an embodiment of the present application, a sum of number of the light-emitting subpixels in the second display area and number of the light-emitting subpixels in the third display area is equal to number of the subpixel driving TFTs in the second display area.

In a splice-type display device provided by an embodiment of the present application, the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

The present application has advantageous effects as follows: based on a bezel-less display panel provided by the embodiment of the present application, a display area of a display panel is divided into a first display area, a second display area around the first display area, and a third display area around the second display area. A plurality of subpixel driving TFTs provided in the first display area have a distribution density equal to a distribution density of a plurality of subpixel driving TFTs provided in the second display area. A distribution density of light-emitting subpixels in the first display area is greater than that of the light-emitting subpixels in the second display area. The third display area is not provided with a subpixel driving TFT. Some of the subpixel driving TFTs in the second display area are connected to the light-emitting subpixels in the second display area, and the other subpixel driving TFTs in the second display area are connected to the light-emitting subpixels in the third display area. In this manner, a bezel-less display can be achieved, a screen aspect ratio, as well as a product application range, can be increased, and display differences caused by splicing marks can be prevented.

DESCRIPTION OF PREFERRED EMBODIMENTS

Figure 1:
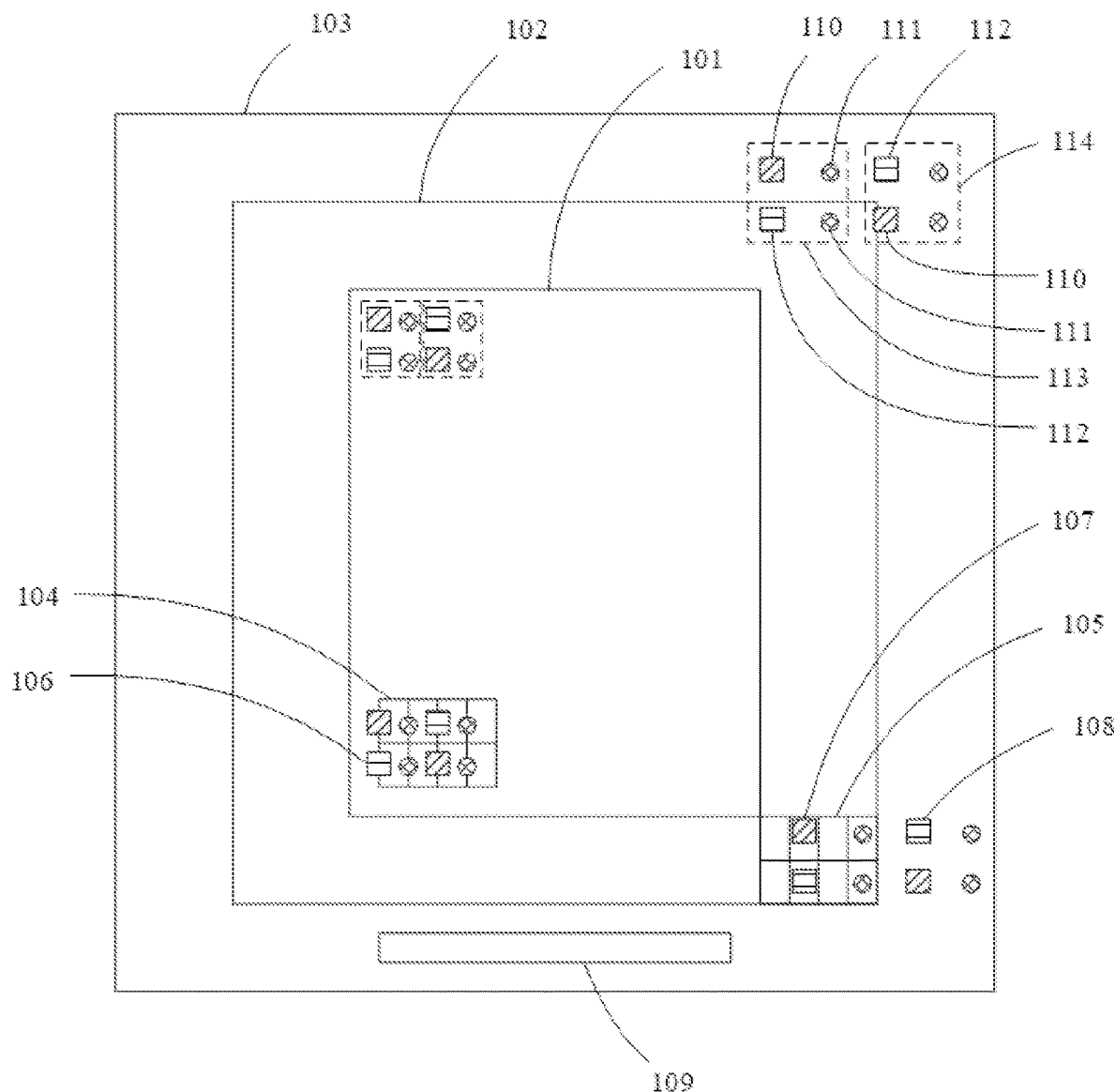
FIG. 1 is a primary schematic structural view of a bezel-less display panel provided by an embodiment of the present application.

In order to make the purpose, technical solutions, and effects of this application clearer, the following further describes this application in detail with reference to the drawings and embodiments. It should be understood that the specific embodiments described herein are only used to explain the application, and not used to limit the application. In the drawings, the sizes of certain layers and regions are exaggerated for better understanding and ease of description.

As shown in FIG. 1, FIG. 1 is a primary schematic structural view of a bezel-less display panel provided by an embodiment of the present application. The bezel-less display panel is divided into a first display area 101, a second display area 102 around the first display area 101, and a third display area 103 around the second display area 102. Each of the first display area 101 and the second display area 102 is provided with a plurality of subpixel driving thin-film transistors (TFTs) (not shown). The subpixel driving TFTs in the first display area 101 have a distribution density equal to a distribution density of the subpixel driving TFTs in the second display area 102.

Figure 2:
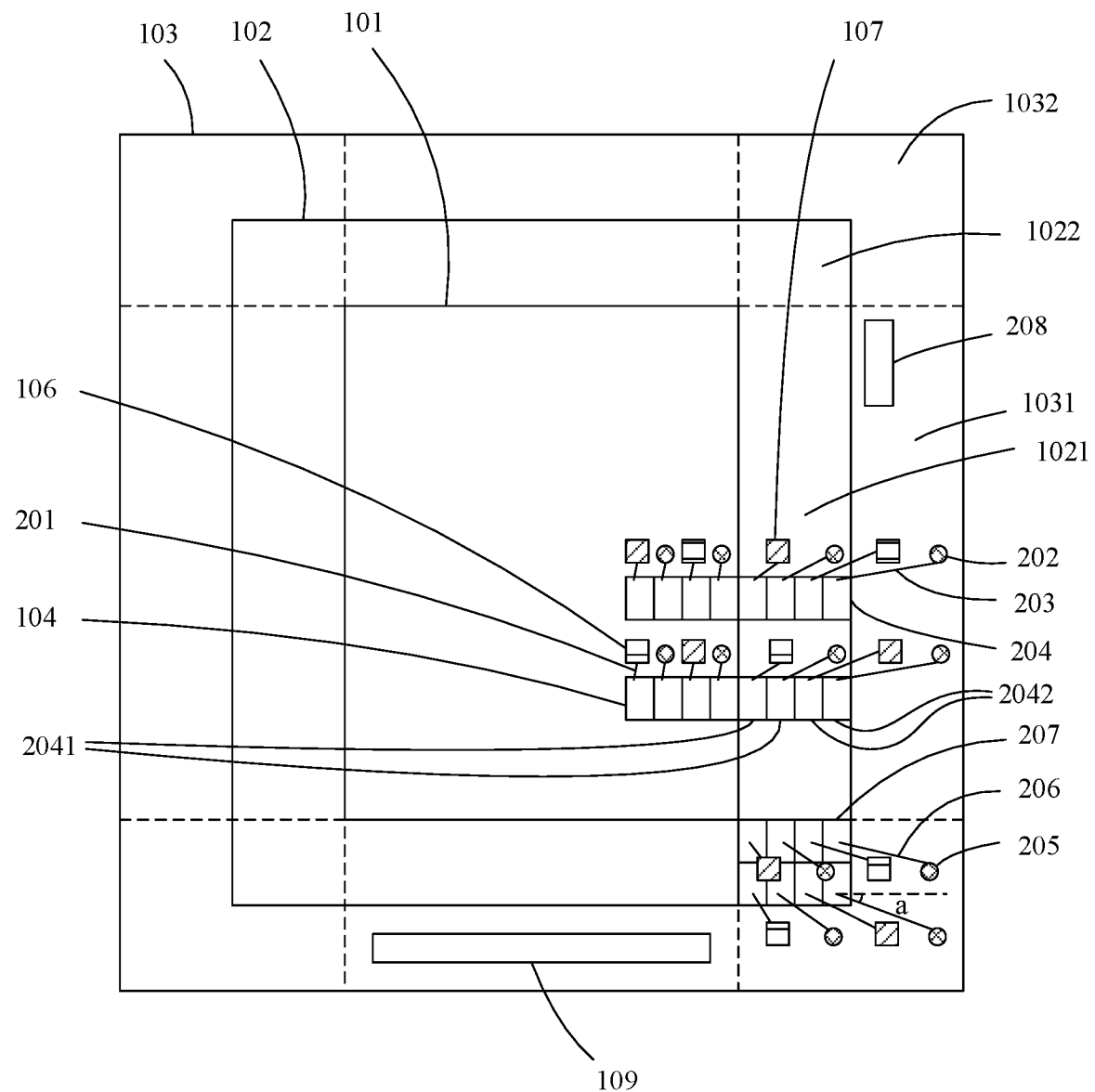
FIG. 2 is a primary schematic structural view of a bezel-less display panel provided by another embodiment of the present application.

It should be noted that FIG. 1 is a schematic view showing a subpixel driving circuit 104 in the first display area 101 and a subpixel driving circuit 105 in the second display area 102, wherein the subpixel driving circuit 104 includes at least one of the subpixel driving TFTs, and the subpixel driving circuit 105 also includes at least one of the subpixel driving TFTs. Since details of the subpixel driving circuits 104 and 105 are not the focus of this application, a detailed structural view is not provided, nor is it described in detail. The subpixel driving circuits 104 and 105 are required only to drive light-emitting subpixels, and circuit details are not limited in this application. In addition, it should be noted that the subpixel driving circuits 104 and 105 are generally located below light-emitting subpixels 106 and 107, and for easy understanding of their relative positions, FIGS. 1 and 2 are both drawn from a top view angle. In addition, due to the top view angle, the subpixel driving circuits 104, 105 and the light-emitting subpixels 106, 107 have a partially overlapping configuration.

Please refer to FIGS. 1 and 2. Each of the first display area 101, the second display area 102, and the third display area 103 is provided with a plurality of light-emitting subpixels 106, 107, 108. A distribution density of the light-emitting subpixels 106 in the first display area 101 is greater than that of the light-emitting subpixels 107 in the second display area 102. Please refer to FIG. 2. There are no subpixel driving TFTs provided in the third display area 103. Some of the subpixel driving TFTs (arranged in a subpixel driving circuit 2041) in the second display area 102 are connected to the light-emitting subpixels 107 in the second display area 102, respectively. The other subpixel driving TFTs (arranged in a subpixel driving circuit 2042) in the second display area 102 are connected to the light-emitting subpixels 202, 205 in the third display area 103 through a plurality of metal lines 203, 206.

It should be noted that bezel-less displaying can be achieved by setting a distribution density of the subpixel driving TFTs (arranged in a subpixel driving circuit 204) in the second display area 102 equal to a distribution density of the subpixel driving TFTs (arranged in a subpixel driving circuit 104) in the first display area 101, and a distribution density of the light-emitting subpixels 107 in the second display area 102 less than a distribution density of the light-emitting subpixels 106 in the first display area 101. That is, the light-emitting subpixels 107 in the second display area 102 are only connected to some of the subpixel driving TFTs (arranged in a subpixel driving circuit 2041) in the second display area 102. Furthermore, the third display area 103 is not provided with any subpixel driving TFT, and the light-emitting subpixels 202, 205 in the third display area 103 are connected to the other subpixel driving TFTs (arranged in a subpixel driving circuit 2042) in the second display area 102 through the metal lines 203, 206, so that configuration of gate lines and driving circuits is not influenced.

In one embodiment, a sum of number of the light-emitting subpixels 107 in the second display area 102 and number of the light-emitting subpixels 202, 205 in the third display area 103 is equal to number of the subpixel driving TFTs (arranged in the subpixel driving circuit 204) in the second display area 102. That is, each of the light-emitting subpixels 107 in the second display area 102 and each of the light-emitting subpixels 202, 205 in the third display are 103 correspond to the subpixel driving TFTs (arranged in the subpixel driving circuit 204) in the second display area 102. Each of the subpixel driving TFTs is corresponding to one of the light-emitting subpixels. In the embodiment of the present application, a distribution density of the light-emitting subpixels in the second display area 102 is reduced, and some of the light-emitting subpixels are distributed to cross to the third display area 103 (corresponding to an outer frame area in prior art), so that a complete full screen display can be achieved, and splicing marks can be prevented when forming a spliced large-sized panel.

In one embodiment, the bezel-less display panel further includes a source driving circuit 109, which is configured to control a voltage (gray scale value) of the light-emitting subpixels to display corresponding brightness. Since the source driving circuit 109 is generally located in the third display area 103 (corresponding to an outer frame area in prior art), the third display area 103 is not available to be provided with a subpixel driving circuit, causing the conventional outer frame area to be incapable of displaying, and a size of the conventional outer frame area is very difficult to be reduced. In order to overcome the above-mentioned problem, the present application is to dispose some of the light-emitting subpixels in the third display area 103 (corresponding to the conventional outer frame area). The light-emitting subpixels 202, 205 in the third display area 103 are connected to the other subpixel driving TFTs (arranged in the subpixel driving circuit 2042) in the second display area 102 through the metal lines 203, 206, thereby to achieve bezel-less display and to prevent configuration of gate lines and driving circuits from being influenced.

Please refer to FIG. 1. In one embodiment, the light-emitting subpixels include a plurality of red subpixels 110, a plurality of green subpixels 111, and a plurality of blue subpixels 112. Specifically, one of the red subpixels 110, two of the green subpixels 111, and one of the blue subpixels 112 cooperatively define a pixel unit. The light-emitting subpixels are arranged in an array and are configured with a plurality of the pixel units comprising a first pixel unit 113 and a second pixel unit 114. In the first pixel unit 113, two of the green subpixels 111 are located on a same side, and one of the red subpixels 110 and one of the blue subpixels 112 are located on another side. In the second pixel unit 114, two of the green subpixels 111 are located on a same side, and one of the red subpixels 110 and one of the blue subpixels 112 are located on another side, wherein the one of the blue subpixels 112 is located above the one of the red subpixels 110. Any row of the pixel units is configured with a plurality of the first pixel units and the second pixel units arranged in a repeating order of the first pixel unit 113 to the second pixel unit 114.

In one embodiment, each of the light-emitting subpixels is circular, triangular, or rectangular in shape. For example, in FIG. 1, the red subpixel 110 and the blue subpixel 112 are both rectangular in shape, and the green subpixel 111 is circular in shape.

In one embodiment, each of the green subpixels 111 has a light-emitting area less than a light-emitting area of each of the red subpixels 110 and blue subpixels 112. It should be noted that since brightness of the red subpixel 110 and the blue subpixel 112 is attenuated faster and the lifespan is shorter, the red subpixel 110 and the blue subpixel 112 is configured with a larger area, so that the brightness attenuation and lifetime of the three types of pixels are uniform.

Figure 4:
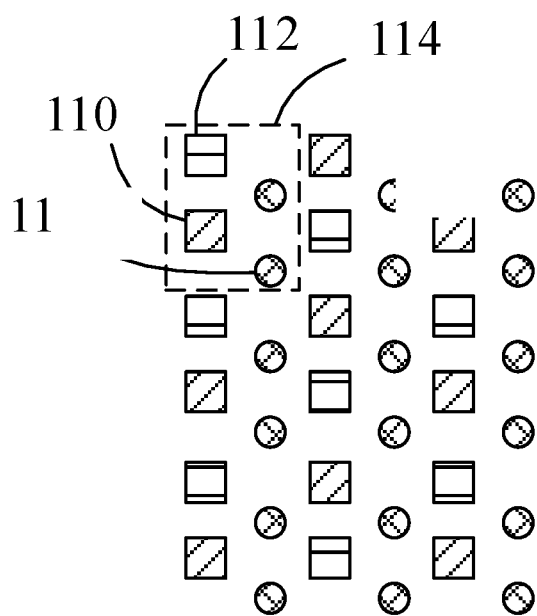
FIG. 4 is a schematic view showing a distribution of subpixels of a bezel-less display panel provided by another embodiment of the present application

Please refer to FIG. 4. In one embodiment, the green subpixels 111 are disposed corresponding to middle and lower positions with respect to the red subpixels 110 and the blue subpixels 112. Specifically, taking the second pixel unit 114 as an example, one of the green subpixels 111 corresponds to a position between the red subpixel 110 and the blue sub-pixel 112, and the other green subpixel 111 corresponds to a lower position of the red subpixel 110. As a whole, the green subpixels 111 are disposed in staggered relationship with the red subpixels 110 and the blue subpixels 112. The green subpixels 111 are disposed to correspond to positions between the red subpixels 110 and the blue subpixels 112.

As shown in FIG. 2, it is a primary schematic structural view of a bezel-less display panel provided by another embodiment of the present application. The bezel-less display panel is divided into a first display area 101, a second display area 102 around the first display area 101, and a third display area 103 around the second display area 102. A plurality of the subpixel driving TFTs 106 in the first display area 101 are connected to a plurality of subpixel driving TFTs of a plurality of the subpixel driving circuits 104 in the first display area 101 through a plurality of metal lines 201, respectively. The second display area 102 includes a first straight area 1021 and a first corner area 1022, and the third display area 103 includes a second straight area 1031 and a second corner area 1032. The light-emitting subpixels 202 in the second straight area 1031 are connected to the subpixel driving TFTs of the subpixel driving circuits 204 in the first straight area 1021 through a plurality of the metal lines 203, respectively. The light-emitting subpixels 205 in the second corner area 1032 are connected to the subpixel driving TFTs of a plurality of subpixel driving circuits 207 in the first corner area 1022 through a plurality of the metal lines 206, respectively.

In one embodiment, the metal lines 203 configured to connect the light-emitting subpixels 202 in the second straight area 1031 to the subpixel driving TFTs in the first straight area 1021 are arranged substantially in a horizontal direction (left and right sides) or in a vertical direction (upper and lower sides). The metal lines 203 in FIG. 2 are not drawn in a horizontal direction for the reason of easy understanding. The metal lines 206 configured to connect the light-emitting subpixels 205 in the second corner area 1032 to the subpixel driving TFTs in the first corner area 1022 are arranged in an oblique direction, wherein a first angle a is formed between the oblique direction and the horizontal direction or the vertical direction. The first angle a is an acute angle. Specifically, the first angle a is greater than 0 degree and less than or equal to 45 degrees.

It should be noted that in the embodiment, the second display area 102 is divided into the first straight area 1021 and the first corner area 1022, the third display area 103 is divided into the second straight area 1031 and the second corner area 1032, then the light-emitting subpixels 202 in the second straight area 1031 are connected to the subpixel driving TFTs in the first straight area 1021. The light-emitting subpixels 205 in the second corner area 1032 are connected to the subpixel driving TFTs in the first corner area 1022. That is, by transversely or longitudinally arranging the light-emitting subpixels in the first straight area 1021, and by disposing the light-emitting subpixels in the first corner area 1022 at the first angle a in the oblique direction, all the light-emitting subpixels can be evenly arranged, and display quality can be improved.

As shown in FIG. 2, in one embodiment, the bezel-less display panel further includes the source driving circuit 109 and a gate driver on array (GOA) driving circuit 208. The GOA driving circuit 208 is configured to control switching on or switching off of any row of the light-emitting subpixels. The GOA driving circuit 208 includes at least a GOA TFT (corresponding to a GOA TFT 312 in FIG. 3). Since the GOA driving circuit 208 is generally configured in the third display area 103 (corresponding to a conventional outer frame area), the third display area 103 is not available for disposing of a subpixel driving circuit, thereby causing the conventional outer frame area to be incapable of displaying, and a size of the conventional outer frame area is very difficult to be reduced. In order to overcome the above-mentioned problem, the present application is to dispose some of the light-emitting subpixels in the third display area 103 (corresponding to the conventional outer frame area). The light-emitting subpixels in the third display area 103 are connected to the other subpixel driving TFTs in the second display area 102 through the metal lines, thereby to achieve bezel-less display and to prevent configuration of gate lines and driving circuits from being influenced.

Figure 3:
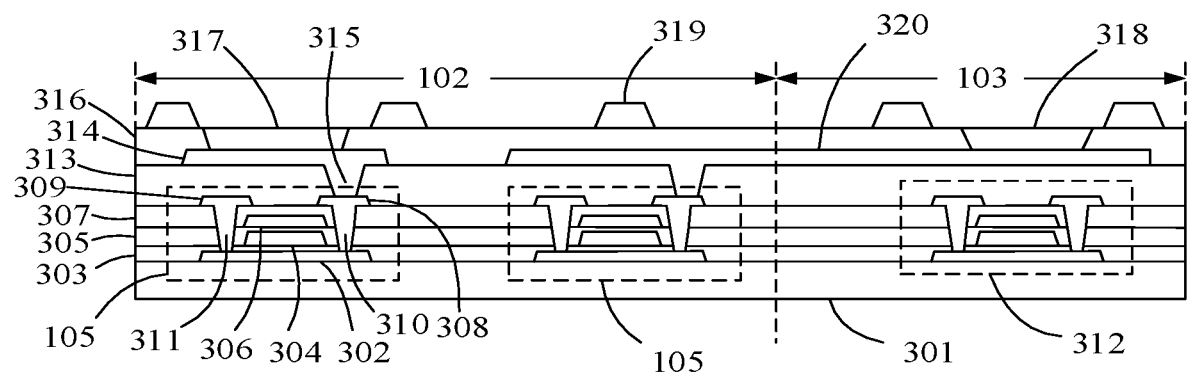
FIG. 3 is a schematic cross-sectional view of a second display area and a third display area of a bezel-less display panel provided by the present application.

As shown in FIG. 3, it is a schematic cross-sectional view of a second display area and a third display area of a bezel-less display panel provided by the present application. From the figure, you can clearly see various components of this application and relative positional relationships between the various components. The bezel-less display panel includes a buffer layer 301, a subpixel driving circuit 105 disposed on the buffer layer 301 and corresponding to the second display area 102, a subpixel driving TFT disposed in the subpixel driving circuit 105, the GOA TFT 312 on the buffer layer 301 and corresponding to the third display area 103, a planarization layer 313 disposed on the subpixel driving circuit 105 and the GOA TFT 312, and a pixel electrode 314 disposed on the planarization layer 313, a pixel definition layer 316 disposed on the planarization layer 313, a light-emitting subpixel 317 disposed on the pixel electrode 314 and corresponding to the second display area 102, a light-emitting subpixel 318 disposed on the pixel electrode 314 and corresponding of the third display area 103, and a supporting spacer 319 disposed on the pixel definition layer 316. A substrate (not shown) may be disposed below the buffer layer 301.

The subpixel driving TFT located in the subpixel driving circuit 105 includes an active layer 302, a first insulating layer 303 disposed on the active layer 302, a first metal layer 304 disposed on the first insulating layer 303, a second insulating layer 305 disposed on the first metal layer 304, a second metal layer 306 disposed on the second insulating layer 305, a third insulating layer 307 disposed on the second metal layer 306, and a source 308 and a drain 309 disposed on the third insulating layer 307. The source 308 is connected to one end of the active layer 302 through a first via 310, and the drain 309 is connected to the other end of the active layer 302 through a second via 311. The pixel electrode 314 is connected to the source 308 through a third via 315.

It should be noted that the light-emitting subpixel 318 in the third display area 103 is connected to the subpixel driving TFTs of the subpixel driving circuit 105 in the second display area 102 through a metal line 320. Specifically, the metal line 320 described here may be disposed on the same layer as the pixel electrode 314, and the light-emitting subpixel 318 in the third display area 103 is connected to the source 308 through the metal line 320. The embodiment of the present application utilizes the subpixel driving TFTs of the subpixel driving circuit 105 in the second display area 102 to control the light-emitting subpixels in the third display area 103, so that bezel-less display can be achieved and configuration of gate lines and driving circuits will not be influenced.

It should be noted that the third display area 103 may not be provided with a thin-film transistor. That is, the GOA TFT 312 can be configured in other ways, and is not limited to the disclosure of the present application.

Figure 5:
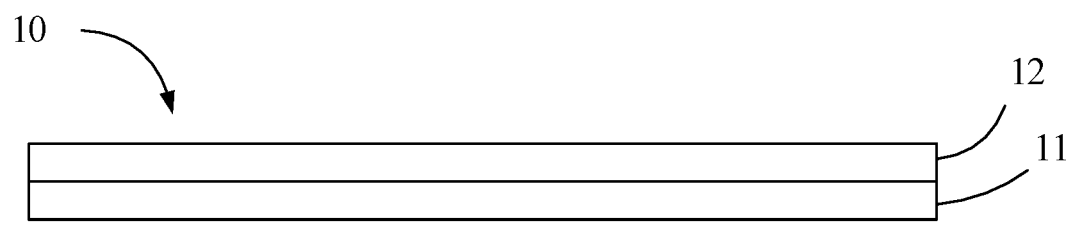
FIG. 5 is a primary schematic structural view of a display device provided by an embodiment of the present application.

Please refer to FIG. 5. An embodiment of the present application provides a display device 10, including a back frame 11, and a bezel-less display panel 12 disposed on the back frame 11, wherein the bezel-less display panel 12 is the bezel-less display panel provided in the above-mentioned embodiments. Please refer to FIGS. 1 and 2 for details, which are not repeated here.

Figure 6:
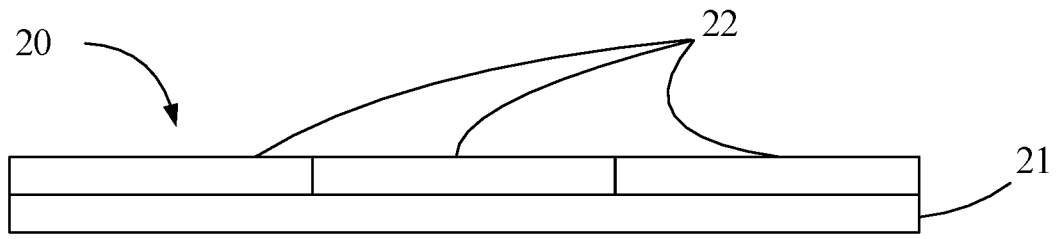
FIG. 6 is a primary schematic structural view of a splice-type display device provided by an embodiment of the present application.

Please refer to FIG. 6. An embodiment of the present application provides a splice-type display device 20, including a back frame 21, and a plurality of bezel-less display panels 22. The plurality of bezel-less display panels 22 are disposed on the back frame 21 and spliced into a display surface, wherein each of the bezel-less display panels 22 is the bezel-less display panel provided by the above-mentioned embodiments. Please refer to FIGS. 1 and 2 for details, which are not repeated here.

It should be noted that each one of the bezel-less display panels can work independently. There are no splicing marks occurred in a splice-type display panel when using the bezel-less display panels provided by the embodiments of the present application, thereby preventing adverse influence on display performance.

Accordingly, based on a bezel-less display panel provided by the embodiment of the present application, a display area of a display panel is divided into a first display area, a second display area around the first display area, and a third display area around the second display area. A plurality of subpixel driving TFTs provided in the first display area have a distribution density equal to a distribution density of a plurality of subpixel driving TFTs provided in the second display area. A distribution density of light-emitting subpixels in the first display area is greater than that of the light-emitting subpixels in the second display area. The third display area is not provided with a subpixel driving TFT. Some of the subpixel driving TFTs in the second display area are connected to the light-emitting subpixels in the second display area, and the other subpixel driving TFTs in the second display area are connected to the light-emitting subpixels in the third display area. In this manner, a bezel-less display can be achieved, a screen aspect ratio, as well as a product application range, can be increased, and display differences caused by splicing marks can be prevented, thereby overcoming technical problems with conventional display panels which have a low screen aspect ratio caused by outer frames being incapable of displaying, and which form splicing marks when being configured to be spliced into a large-sized display, adversely affecting display performance.

It can be understood that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. A display panel, comprising:
   a first display area and a second display area adjacent to the first display area,
   wherein each of the first display area and the second display area is provided with a plurality of subpixel driving thin-film transistors (TFTs) and a plurality of light-emitting subpixels, the subpixel driving TFTs in the first display area have a distribution density equal to a distribution density of the subpixel driving TFTs in the second display area, and a distribution density of the light-emitting subpixels in the first display area is greater than a distribution density of the light-emitting subpixels in the second display area; and
   wherein the light-emitting sub-pixels are also arranged on a periphery of the second display area, some of the subpixel driving TFTs in the second display area are connected to the light-emitting subpixels in the second display area, and the other subpixel driving TFTs in the second display area are connected to the light-emitting subpixels on the periphery of the second display area through a plurality of metal lines.

2. The display panel of claim 1, wherein the metal lines are arranged in an oblique direction, a first angle is formed between the oblique direction and the horizontal direction or the vertical direction, and the first angle comprises an acute angle.

3. The display panel of claim 1, wherein the second display area comprises a first straight area and a first corner area, and a periphery corresponding to the first straight area and the first corner area further comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

4. The display panel of claim 3, wherein the metal lines configured to connect the light-emitting subpixels in the second straight area to the subpixel driving TFTs in the first straight area are arranged in a horizontal direction or in a vertical direction.

5. The display panel of claim 3, wherein the metal lines configured to connect the light-emitting subpixels in the second corner area to the subpixel driving TFTs in the first corner area are arranged in an oblique direction, wherein a first angle is formed between the oblique direction and the horizontal direction or the vertical direction.

6. The display panel of claim 1, wherein a sum of a number of the light-emitting subpixels in the second display area and a number of the light-emitting subpixels on the periphery of the second display area is equal to number of the subpixel driving TFTs in the second display area.

7. The display panel of claim 1, wherein the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

8. The display panel of claim 7, wherein the light-emitting subpixels are arranged in an array, and the pixel units comprise a first pixel unit and a second pixel unit,
wherein in the first subpixel unit, two of the green subpixels are located on a same side, and one of the red subpixels and one of the blue subpixels of the first subpixel unit are located on another side, and the red subpixels is located above the blue subpixels; and
wherein in the second subpixel unit, two of the green subpixels are located on a same side, and one of the red subpixels and one of the blue subpixels of the second subpixel unit are located on another side, and the blue subpixels is located above the red subpixels.

9. The display panel of claim 8, wherein the green subpixels are disposed to correspond to middle and lower positions with respect to the red subpixels and the blue subpixels, respectively.

10. The display panel of claim 8, wherein each row of the pixel units is arranged in a repeating sequence of the first pixel unit followed by the second pixel unit.

11. A display device, comprising:
a back frame; and
a display panel disposed on the back frame, wherein the display panel comprises a first display area and a second display area adjacent to the first display area,
wherein each of the first display area and the second display area is provided with a plurality of subpixel driving thin-film transistors (TFTs) and a plurality of light-emitting subpixels, the subpixel driving TFTs in the first display area have a distribution density equal to a distribution density of the subpixel driving TFTs in the second display area, and a distribution density of the light-emitting subpixels in the first display area is greater than a distribution density of the light-emitting subpixels in the second display area; and
wherein the light-emitting sub-pixels are also arranged on a periphery of the second display area, some of the subpixel driving TFTs in the second display area are connected to the light-emitting subpixels in the second display area, and the other subpixel driving TFTs in the second display area are connected to the light-emitting subpixels on the periphery of the second display area through a plurality of metal lines.

12. The display device of claim 11, wherein the metal lines are arranged in an oblique direction, a first angle is formed between the oblique direction and the horizontal direction or the vertical direction, and the first angle comprises an acute angle.

13. The display device of claim 11, wherein the second display area comprises a first straight area and a first corner area, and a periphery corresponding to the first straight area and the first corner area further comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

14. The display device of claim 11, wherein a sum of number of the light-emitting subpixels in the second display area and number of the light-emitting subpixels on the periphery of the second display area is equal to number of the subpixel driving TFTs in the second display area.

15. The display device of claim 14, wherein the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

16. A splice-type display device, comprising:
a back frame; and
a plurality of display panels disposed on the back frame and configured to provide a display surface, wherein each of the display panels comprises a first display area and a second display area adjacent to the first display area,
wherein each of the first display area and the second display area is provided with a plurality of subpixel driving thin-film transistors (TFTs) and a plurality of light-emitting subpixels, the subpixel driving TFTs in the first display area have a distribution density equal to a distribution density of the subpixel driving TFTs in the second display area, and a distribution density of the light-emitting subpixels in the first display area is greater than a distribution density of the light-emitting subpixels in the second display area; and
wherein the light-emitting sub-pixels are also arranged on a periphery of the second display area, some of the subpixel driving TFTs in the second display area are connected to the light-emitting subpixels in the second display area, and the other subpixel driving TFTs in the second display area are connected to the light-emitting subpixels on the periphery of the second display area through a plurality of metal lines.

17. The splice-type display device of claim 16, wherein the metal lines are arranged in an oblique direction, a first angle is formed between the oblique direction and the horizontal direction or the vertical direction, and the first angle comprises an acute angle.

18. The splice-type display device of claim 16, wherein the second display area comprises a first straight area and a first corner area, and a periphery corresponding to the first straight area and the first corner area further comprises a second straight area and a second corner area, wherein the light-emitting subpixels in the second straight area are connected to the subpixel driving TFTs in the first straight area through a plurality of the metal lines, respectively, and the light-emitting subpixels in the second corner area are connected to the subpixel driving TFTs in the first corner area through a plurality of the metal lines, respectively.

19. The splice-type display device of claim 16, wherein a sum of number of the light-emitting subpixels in the second display area and number of the light-emitting subpixels on the periphery of the second display area is equal to number of the subpixel driving TFTs in the second display area.

20. The splice-type display device of claim 19, wherein the light-emitting subpixels comprise a plurality of red subpixels, a plurality of green subpixels, and a plurality of blue subpixels, wherein one of the red subpixels, two of the green subpixels, and one of the blue subpixels cooperatively define a pixel unit.

* * * * *